United States Patent [19]

Westerberg

[11] 3,962,688
[45] June 8, 1976

[54] OPTICAL MASS DATA MEMORY

[76] Inventor: Erik Gerhard Natanael Westerberg, Hastskovagen 7A, S-183 50 Taby, Sweden

[22] Filed: Apr. 2, 1975

[21] Appl. No.: 564,637

[30] Foreign Application Priority Data
Apr. 16, 1974 Sweden .............................. 7405076

[52] U.S. Cl. .......................... 340/173 LM; 350/161; 340/173 LT
[51] Int. Cl.² .................. G11C 13/04; G11C 11/42
[58] Field of Search ............... 340/173 LT, 173 LM; 350/161

[56] References Cited
UNITED STATES PATENTS

| | | | |
|---|---|---|---|
| 3,696,344 | 10/1972 | Feinleib | 340/173 LM |
| 3,720,924 | 3/1973 | Aagard | 340/173 LM |
| 3,744,039 | 7/1973 | Hrbek | 340/173 LM |
| 3,774,172 | 11/1973 | Silverman | 340/173 LM |
| 3,898,629 | 8/1975 | Westerberg | 340/173 LM |

*Primary Examiner*—Terrell W. Fears
*Attorney, Agent, or Firm*—Cushman, Darby & Cushman

[57] ABSTRACT

An optical memory for storing large amounts of information with a great packing density having writing and reading cycles controlled by a computer. A laser beam provides writing and reading of information on and from, respectively, a rotating memory disk in response to acousto-optical modulation of the beam. This modulation provides fine adjustment of the beam in the radial direction of the disk while coarse adjustment of the beam takes place mechanically. An acousto-optical modulator is arranged in the path of the laser beam, for both amplitude and frequency modulating the beam, so that it is fine adjusted for deflection, or for providing different intensities, while a mechanical coarse adjusting unit stepwise displaces the beam in the radial direction of the disk.

8 Claims, 1 Drawing Figure

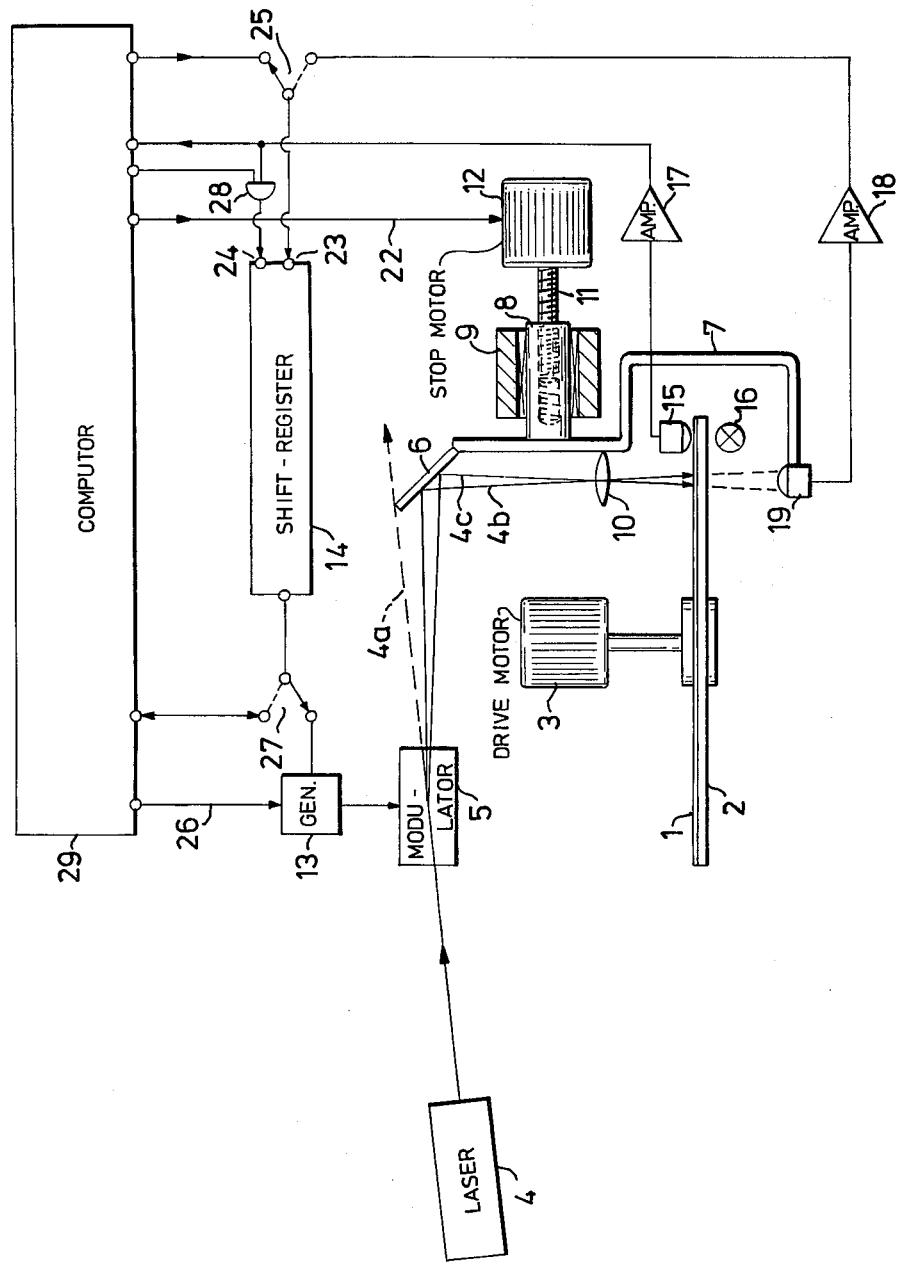

OPTICAL MASS DATA MEMORY

The present invention relates to an optical memory for storing large amounts of information with great packing densities with recording and reading cycles controlled by a computer. A laser beam provides recording and reading of information, respectively, on and from a rotating memory disk in response to modulation of the beam, this modulation providing fine adjustment of the beam in the radial direction of the disk, whereas coarse adjustment of the beam takes place mechanically.

In data storage devices of the rotating disk memory type, which by the application of optical reading and recording techniques enable very high storage or packing densities, great demands are placed not only on the mechanical journalling of the disk, but also on accurately directing the beam used onto a definite information containing track on the disk memory, since the track pitch only needs to be about 5 microns. This high packing density, which is a pair of orders of magnitude greater than what can be achieved with magnetic tape or magnetic disks, is enabled, by using laser radiation amongst other things, with which a method of burning small holes in the storing medium of the memory disk has been proposed. In consequence of the high packing density, very accurate reading and recording mechanisms are required, and to solve the problems with this accuracy it has already been proposed in the use of laser techniques to both finely and coarsely adjust the radiation from the laser so that the laser beam strikes the desired track on the disk. In these known devices, extensive and complicated apparatus is required however, and above all it would be difficult to get this apparatus reproducible within such tolerances that memory disks could easily be exchanged between different computer installations.

An optical memory is known through the German Offenlegungsschrift (application published in print) No. 2,324,778, where fine and coarse adjustment of the beam takes place, the coarse adjustment being carried out by means of a rotatable mirror, while the fine adjustment is carried out by means of acousto-optical deflection of the laser beam. This beam passes through an optical projection system which is stationary, and therefore must have considerable extension at least in a plane parallel to the memory disk to cover the pertinent area on the disk, it being necessary to utilize a projection lens demanding both correction and a cost of the order of magnitude of approximately 1250 dollars. A special modulator is further required for altering the intensity of the laser beam, a special acousto-optical deflecting unit for deflecting it, and a lens system between the modulator and the deflecting unit for enlarging the diameter of the beam.

These inconveniences with known data memories in regard to complicated construction and expensive components are dispensed with as a result of the present invention since the data memory mentioned in the introduction includes an acousto-optical modulator arranged in the path of the laser beam, which both amplitude and frequency modulates the beam, so that this is fine-adjusted by deflection or obtains different intensities, and by a mechanical coarse adjustment unit for step-wise displacement of the beam in the radial direction of the disk.

The invention is more closely described below an embodiment thereof while referring to the attached drawing, which schematically illustrates the construction of the data memory according to the invention.

According to the drawing the optical memory comprises a transparent memory disk 2, which during operation is caused to rotate by means of a driving motor 3. On one side the disk is provided a storing medium such as an opaque coating 1 in the form, for example, of a thin foil or film. A laser beam emanating from a laser 4 passes through an acousto-optical modulator 5 to be reflected by a mirror 6 when the beam strikes it, the beam being focused on the storing medium 1 by means of a lens 10 which in practice is composed of several cheap standard elements. A photoelectric beam detector 19 is situated in the path of the beam opposite the lens 10 on the side of the memory disk 2 facing away from the lens. The recording of information supplied by a computer 29 takes place along concentric circles or tracks on the disk 1,2, each track holding 16384 or $2^{14}$ bits in the form of ones or zeros. With a track pitch of 5 microns, for example, and a track extension in the radial direction of 1.5 cm, the disk holds 3000 tracks, so that a total of about $45.10^6$ bits can be stored simultaneously. Recording on the disk takes place with the aid of the laser beam, which for a binary one is reflected according to 4b or 4c in such a way that it strikes the desired track and burns a hole through the medium 1 with a diameter of the micron order of magnitude. When a binary zero is to be recorded, the beam is deflected according to 4a so that it passes to one side of the reflecting surface of the mirror 6 and thereby does not strike the foil 1. Zeros can naturally also be recorded by amplitude modulated alteration of the laser beam intensity, so that this does not burn a hole. Deflection takes place with the help of the acousto-optical modulator 5, which is supplied with a signal from a signal generator 13, the laser beam being both amplitude and frequency modulated by the signal, which has a frequency of between 30 and 70 MHz. In response to this modulating frequency, the deflecting angle of the beam is altered in the modulator 5, and if there is no modulation the beam follows the dotted line 4a, not then striking the reflecting mirror surface. In response to the degree of amplitude modulation, the intensity of the beam is altered between full strength and zero so that the beam can burn holes in the foil 1 for recording, and pass through these without perforating effect for reading.

A buffer memory in the form of a shift register 14 is arranged between the memory disk 1,2 and the computer 29, the length of the buffer memory and thereby its storage capacity corresponding to the number of bits along a track, i.e. the above-mentioned number $2^{14}$. The register 14 must be advanced or shifted with regard to its contents synchronously with the rotation of the memory disk, so that the $2^{14}$ bits exactly fill the $2^{14}$ digit positions of the register when reading from the disk. This synchronization is carried out by the aid of a clockpulse generator with a pre-arranged clock channel close to the periphery of the disk in the form of a circular track with small uniformly distributed holes along the track which divide the disk into $2^{14}$ similar sectors or angles. The generator furthermore includes a light source 16 and a photodetector 15, which via an amplifier 17 are connected to an input of the computer 29. The already described fine-adjustment of the laser beam by the modulation in the modulator 5 is also combined with coarse adjustment, since the striking point of the beam on the disk 1,2 cannot be moved over the total radial extension of the tracks by means of the fine-adjustment so that this point always coincides with the selected track. The coarse adjustment involves simultaneous mechanical displacement of the mirror 6, the lens 10 and the detector 19 in a radial direction relative to the memory disk, the system consisting of these three elements being attached to a commmon support 7 which in turn is attached to a movable slide 8 in a stationary part 9. A precision screw 11 is rotatably threaded into this slide 8, the screw constituting an extension of the driving shaft of a linear step motor 12. The system 6,7,8,10 and 19, radially movable over the disk 1,2 is thus displaced stepwise, when the motor 12 is activated, whereat the travel per step can be altered from approximately 5 to approximately 50 microns by a suitably selected pitch for the screw 11. The first value is required if the radial displacement takes place solely mechanically, the focused beam thereby describing concentric circles with a pitch of 5 microns. Quicker track selection is attained if mechanical stepping is allowed to attain a greater value, such as 50 microns, when beam deflection in 9 steps is required for covering intermediate tracks.

With regard to the fine adjustment of the laser beam by deflection in the modulator 5, it may happen that the beam does not exactly strike the track intended for reading, but is displaced somewhat to one side. This is possible to detect in combination with suitable devices which cause the beam to move zig-zag over the track to measure the amplitude of the signal sent by the photo-detector 19, the striking point of the beam on the disk being then adjusted to a position corresponding to maximum amplitude.

Recording information from the computer 29 on the memory disk 1,2 takes place according to the following. By means of the computer, a switch 25 is set to the contact position shown on the drawing, whereafter the computer fills the shift register 14 via its data input 23, while $2^{14}$ advancing or shift pulses are simultaneously applied to the register 14 shift pulse input 24 via an AND-gate 28. Thereafter the computer 29 sets a switch 27 to the contact position shown on the drawing, and orders subsequent or simultaneous adjustment of the beam to the desired track on the memory disk 1,2, e.g. track number 376. Signals corresponding to the decades 37 in this address are fed via a wire 22 to the step motor 12, which then stepwise displaces the movable slide 8 together with appurtenant lens system 6,10 to track 370. A signal corresponding to the digit 6 is sent via a wire 26 to the high frequency generator 13 to set the generator to a frequency distinguishing this digit. The generator frequency can be voltage controlled, for example, the computer selecting different voltages corresponding to the digits 0-9 and supplying the generator 13 with the necessary voltage via the wire 26. When the memory disk assumes a definite angular position, e.g. one distinguished by a hole in the clock channel with a greater diameter than remaining holes in this channel, and which is detected by the detector 19 in combination with the amplifier 17, the clock pulse generator 15-17 is connected to the shift pulse input 24 on the register 14, to empty this of its information content, which via the switch 27 is supplied to the generator 13. This generator will then activate the modulator 5 in accordance with the information fed to it, so that the intensity of the laser beam departing from the modulator is caused to vary according to the information which is recorded either in the form of holes (ones), or opaque places (zeros) along the memory disk track number 376.

The reverse cycle is carried out for reading. The computer 29 sets the switch 25 to the contact position given by dotted lines, and waits for the moment when the memory disk 1,2 assumes the definite angular position and the clock pulse generator 15-17 is connected to the shift pulse input 24 of the register 14 for shifting its information. Setting to the desired track is assumed to have taken place beforehand in the same way as is described above for recording. Furthermore, the generator 13 has been set so that the laser beam is given such limited intensity that the storing medium 1 is not damaged or burnt away during reading. Signals corresponding to the information stored on the disk are now fed out from the photo detector 19, amplified in the amplifier 18 and applied to the register input 23 so that the register 14 is filled synchronously with rotation of the memory disk. After $2^{14}$ shift pulses the computer 29 interrupts information supply to the register, e.g. by cutting off the supply of shift pulses to the input 24. Transference from shift register to computer takes place by setting the switch 27 to the contact position shown in dotted lines, while shift pulses are once again applied to the input 24 and the data input 23 is not connected.

What I claim is:

1. An optical memory for storing large amounts of information with a great packing density having recording and reading cycles controlled by a computer, there being a laser beam to provide recording and reading of information respectively on and from a memory disk rotating in operation, in response to acousto-optical modulation of the beam, this modulation providing fine adjustment of the beam in the radial direction of the disk while coarse adjustment of the beam takes place mechanically, characterized by an acousto-optical modulator arranged in the path of the laser beam for both amplitude and frequency modulating the beam, so that it is fine adjusted by deflection, or for providing different intensities, and by a mechanical coarse adjusting unit for stepwise displacement of the beam in the radial direction of the disk.

2. A memory as claimed in claim 1, characterized in that the coarse adjusting unit comprises a step motor, which in response to signals from the computer displaces a lens system introduced into the path of the beam for directing the laser beam to definite points on the memory disk.

3. A memory as claimed in claim 1 with a buffer memory for storing the information to be recorded or read from the memory disk in binary form, characterized in that the buffer memory is a shift register with a capacity for storing the same number of bits as are kept on one circular track on the disk, the bits being fed to and from and are shifted in the register synchronously with turning the disk.

4. An optical memory system for storing large quantities of data with a large packing density on a disk memory including means for generating a laser beam for recording and reading information on said disk, and a computer for controlling the recording and reading cycles of said memory, the improvement comprising an acousto-optical means for amplitude and frequency modulating said laser beam, said modulation of said beam varying the intensity of said beam and adjusting the radial position of the beam with respect to said disk, and a mechanical coarse adjusting means for step-wise displacing said beam in the radial direction with respect to said disk.

5. The optical memory system of claim 4 further comprising a buffer memory for storing information to be recorded or read from the memory disk in binary form, said buffer memory including a shift register having the same bit storage capacity as one circular track on said disk, said bits being fed into and out of said shift register synchronously with the rotation of said disk.

6. The optical memory system of claim 5 further comprising means for synchronizing the transmittal of information with respect to said shift register in accordance with the rotation of said disk.

7. The optical memory system of claim 6 further comprising tracking means for directing said laser beam onto a predetermined track of said disk memory.

8. The optical memory system of claim 7 wherein said coarse adjusting means comprises a step motor, and a lens means responsive to said step motor for directing said laser beam to a predetermined radial location on said disk, said step motor being controlled by said computer.

* * * * *